(12) United States Patent
McDermott

(10) Patent No.: US 6,361,190 B1
(45) Date of Patent: Mar. 26, 2002

(54) LARGE SURFACE LED LIGHTING DEVICE

(76) Inventor: Kevin McDermott, 196 Phillips Dr., Hampstead, MD (US) 21074

( * ) Notice: Subject to any disclaimer, the term of this patent is extended or adjusted under 35 U.S.C. 154(b) by 0 days.

(21) Appl. No.: 09/344,041

(22) Filed: Jun. 25, 1999

(51) Int. Cl.⁷ .................................................. F21V 5/00
(52) U.S. Cl. ...................... 362/310; 362/800; 362/277; 362/307; 362/255; 362/256; 313/512
(58) Field of Search ................................. 313/512, 114, 313/113; 362/310, 277, 307, 800, 298–300, 302, 255, 256; 257/98

(56) References Cited

U.S. PATENT DOCUMENTS

| | | | |
|---|---|---|---|
| 4,698,730 A | * | 10/1987 | Sakai et al. .................. 362/311 |
| 5,865,529 A | * | 2/1999 | Yan ............................. 362/327 |
| 6,227,685 B1 | * | 5/2001 | McDermott ................. 362/318 |

* cited by examiner

*Primary Examiner*—Sandra O'Shea
*Assistant Examiner*—Anabel Ton

(74) *Attorney, Agent, or Firm*—Francis C. Hand, Esq.; Carella, Byrne, et al.

(57) ABSTRACT

An enlarged surface LED lighting device having an interior reflector disposed and configured to reflect the light emitted by a LED element to increase the divergence of the light and form an interior reflected light. The interior reflector is typically a surface of revolution about the pattern axis configured to reflect and bend the light away from the axis of the spatial radiation pattern of the emitted light. The interior reflector is also formed to Increase the transfer of heat away from the LED element. The interior reflector is usually disposed in close proximity to the LED element to maximize the percentage of emitted light it redirects. The lighting device additionally includes an exterior reflector also normally a surface of revolution about the pattern axis. The exterior reflector is disposed and configured to reflect the interior reflected light previously reflected by the interior reflector to form an exterior reflected light and usually to decrease the divergence of -the interior reflected light about the pattern axis. The emerging light as a result of the interior and exterior reflectors emerges from the lighting device from a large lighted area.

66 Claims, 9 Drawing Sheets

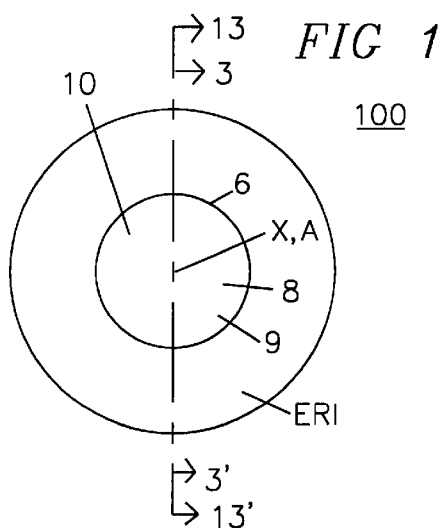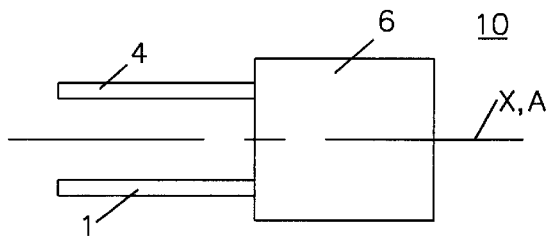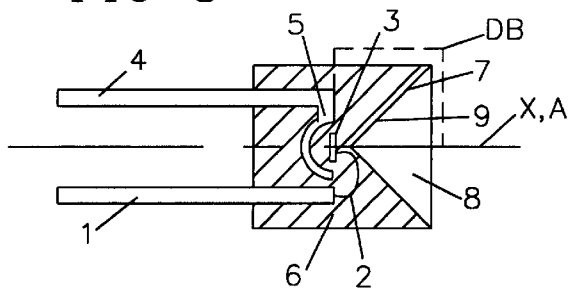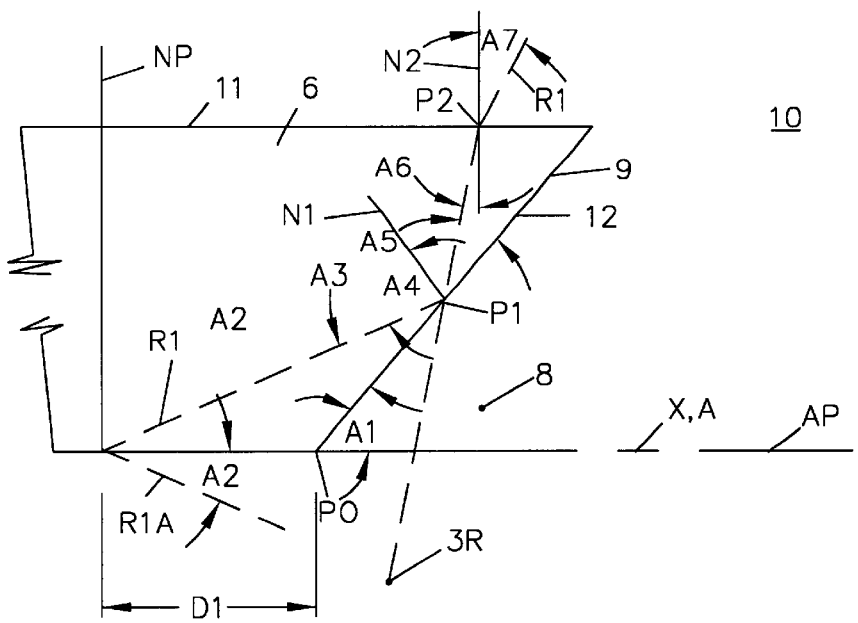

LARGE SURFACE LED LIGHTING DEVICE

BACKGROUND OF INVENTION

1. Field of the Invention

This invention relates to a LED lighting device having a plurality of reflectors of improved shape and disposition to sequentially reflect a substantial portion of the light emitted by the LED element to effect a lighting device having a large lighted surface. The enlarged lighted surface created by the current invention provides a more visible lighting device with a reduction in the hot spot characteristic of normal LED lamps.

2. Description of Prior Art

FIG. 21 shows a diagrammatic partial sectional view of a conventional prior art LED lamp C10. In FIG. 21 positive lead C1 is the positive lead wire. Contact wire C2 connects positive lead C1 to LED element C3. Negative lead C4 is the negative lead wire. Negative lead wire C4 has reflective cup C5 which partially surrounds LED element C3. LED body C6 is formed of a transparent resin which encapsulates LED element C3 and reflective cup C5. LED body C6 forms converging lens C7 which refracts and bends the light. If adequate electrical voltage is connected to positive lead wire C1 and negative lead wire C2 LED element C3 is energized to emit light. The emitted light forms a spatial radiation pattern. The light is moderately diverging and substantially centered about a pattern axis CA of the spatial radiation pattern.

A first portion of the emitted light proceeds directly through lens C7. A second portion of the emitted proceeds into concave reflective cup C5 whereat it is reflected and thereby redirected to also pass through concentrating lens C7. Both the first and second portions of light therefore are refracted at lens C7 to emerge concentrated about lamp body axis CX of LED lamp C10. Lamp body axis CX is the geometric axis of lamp body C6 and is coincident with pattern axis CA. Thus this prior art design of LED lamp C10 emits light concentrated about body axis CX of LED lamp C10.

For some uses concentration of the light about body axis CX is desirable. Other uses require the emerging light to be less concentrated. Refracting lens C7 can have a variety of shapes, however, it is not possible to reshape refractive surface C7 to effect the required divergence of the light for many uses. For these uses prior art designs employ a body C6 formed of a diffusing epoxy—usually milky white—to encourage the divergence of the light about the pattern axis CA. This design is inefficient as light is absorbed and lost within the diffusing epoxy.

FIG. 22 is an end view of the FIG. 21 lamp as it would be seen by an observer along pattern axis CA. The size of the lamp as it appears to an observer is established by the size of LED body C6 which is usually small ranging up to 10 millimeters in diameter. This small size creates a hot spot with a high value of light energy per square millimeter leaving lens C7. This hot spot can be a problem as it impresses an image on a viewers eye which takes time to recede. It can also damage the viewers eye. The size of the lighted area can be increased by increasing the diameter of body C6. This however increases the mass and the cost of the device. It also can reduce the efficiency as light energy is lost passing through thick sections of the transparent resin.

SUMMARY OF THE INVENTION

The current invention employs an interior and an exterior reflector to sequentially reflect the light emitted by an LED element to create an efficient enlarged lighted surface LED lighting device. The current invention can be configured so that it comprises a large lighted surface even when the device is of limited mass and thickness.

The current invention initially efficiently spreads the light emitted by a LED element by providing an interior reflector of a size and disposition adequate to intersect the first portion and for some embodiments including a cup reflector both the first and the second portion of light emitted by the LED element. For the following discussion the light reflected can be the sum of the first and second portions previously described for prior art or it can be either the first or the second portion of the light. The interior reflector of the current invention is usually designed to bend the light away from a pattern axis of the emitted light. The interior reflector could alternatively be considered as designed to reflect the light to bring it towards parallelism with a reference plane normal to the pattern axis of the light emitted by the LED element. The interior reflective surface is usually disposed in close proximity to the LED element so that it can intercept a large percentage of the emitted light. The efficiency of the design can be maximized by locating the interior reflective surface sufficiently close to the LED element and by employing an interior reflective surface having an acceptable contour.

In one embodiment of the current invention the interior reflective surface is achieved by contouring the resin body which encapsulates the LED element such that the reflective nature of the interior reflective surface is the result of an internal reflection of the light. This embodiment is desirable because designing the resin body of the device to employ internal reflection usually minimizes the cost of the device. The interior reflective surface can alternatively also be achieved by coating a contoured surface of the resin body with a metallic coating. The interior reflector can alternatively be a discrete reflector attached to the LED element.

For some uses it is desirable that the light emitted by the lighting device substantially evenly illuminate a hemisphere centered about the LED element. For this requirement one embodiment of the current invention permits a percentage of the emitted light to pass through the interior reflective surface so that the light will not be totally reflected thereby avoiding dark zones within the hemisphere. This can be achieved by contouring the interior reflective surface to create internal reflection but not total internal reflection. In this embodiment a percentage of the emitted light is permitted to pass through the interior reflective surface to thereby distribute some of the emitted light within a hemisphere having the pattern axis of the emitted light as its axis. Alternatively, this result can be achieved by coating the interior reflective surface with a very thin coat of a metallic reflective coating thereby permitting a percentage of the emitted light to pass through the reflector to abet a more uniform distribution of emitted light within the hemisphere while reflecting a large portion of the emitted light to increase its divergence from the pattern axis. The light which passes through the reflective surface is refracted to form the required spectral radiation pattern of the light emerging from the lighting device. Finally, partial reflection can be achieved if the interior reflective surface is roughened or sanded. In this embodiment, the interior reflective surface will no longer have the smooth finish necessary for total internal reflection permitting some light to pass through.

Other uses require most of the light to be brought into a substantially parallel relationship with the pattern axis of the light. For these uses, an additional embodiment of the current invention employs a substantially parabolic contour on the interior reflector. This results in a concentration of the light about a plane normal to the pattern axis. A conical exterior reflector is provided to subsequently reflect the light to bring it towards parallelism with the pattern axis.

Finally, there are other requirements where the light must be bent away from the pattern axis to increase its divergence about the pattern axis into a user defined specific energy pattern about the pattern axis. These requirements are met with an embodiment of the current invention comprising a contouring of the exterior reflector to correspond to the contour of the interior reflector to distribute the light into the specific energy pattern required.

The interior reflector can—for some embodiments of the current invention—be a discrete component attached to the LED element or to the body of the lighting device. However, usually the interior reflector is formed of the surface of the resin body which encapsulates the LED element. This design is desirable because forming the interior reflector from the resin body enhances the efficiency of the lighting device by minimizing the number of surfaces separating mediums of different indicies of refraction through which the light must pass before exiting the lighting device. Additionally forming the interior reflector of the resin body permits more accurate disposition of the reflector relative to the LED element thereby maximizing the accuracy of the redirection of the emitted light. Finally, this design is less expensive as it eliminates the need for a separate reflector which must be attached to the LED element. The exterior reflector to be later described can be similarly formed of the resin body of the device to further enhance the efficiency and reduce the cost of the device.

Subsequent to its reflection at the interior reflector an exterior reflector intersects and reflects the light. Usually the exterior reflector decreases the lights divergence about the pattern axis. Upon reflection at the exterior reflector the light—depending upon a number of parameters—can emerge with a beam pattern similar to that of the light emerging from the prior art LED lamp of FIG. 21. There will be however substantial differences when viewed at a small distance such as distances of less than ten feet because the size of the lighted surface of the current invention will be larger than the lighted surface of the prior art FIG. 21 LED lamp. As a result of the large lighted surface the current invention will emit less energy per unit of surface area and thus be less prone to damaging a viewers eye. Finally, due to the limitations of the prior art lens C7 regarding refraction and its ability to collect a large percentage of emitted light the current invention which employs reflectors can project more of the light into a required beam pattern.

Although the current invention can be designed to emit light with a beam pattern having a divergence similar to that of prior art FIG. 21 while achieving the benefit of an enlarged lighted surface it also can be designed to achieve a second benefit of emitting light with an increased divergence about the pattern axis.

In addition to the interior and exterior reflectors, the current invention can additionally comprise a reflective cup similar to that previously described as reflective cup C5 of prior art FIG. 21. For this embodiment the light reflected by the interior reflector of the current invention includes the second portion of the light previously reflected by the reflective cup and identified as cup reflected light of prior art FIG. 21. This light will have been reflected three times prior to emerging from the current lighting device. Substantially all of the embodiments of the current invention shown herein function with or without the reflective cup.

It is an object of the current invention to sequently reflect light emitted by a LED element from an interior reflector with a lighted area or reflective surface of a first size to an exterior reflector with a lighted area or a reflective surface of a larger size. The light emerges from the lighting device from the large reflective surface of the exterior reflector making the lighting device more visible and less prone to effecting eye damage.

It is another object of the current invention to provide a LED lighting device which employs an interior reflector to reflect and bend the light emitted by its LED element such that as a result of reflection the parallelism between the light and a normal reference plane perpendicular to the pattern axis of the light as first emitted by the LED element is increased. Subsequently the reflected light is again reflected by an exterior reflector to decrease the parallelism between the light and the normal reference plane.

It is another objective of the current invention to contour and position an interior reflector to intersect light emitted from a LED element at acute angles of less than 40 degrees of its pattern axis to reflect that light to increase the divergence of that light about the pattern axis. Subsequently, the light is again reflected by an exterior reflector to decrease the divergence between the light and the pattern axis.

Another embodiment the current invention provides a LED lighting device whereby the light emitted by a LED element is subjected to at least two reflections such that at least fifty percent of the light emerging from the lighting device emerges within an angle of 30 degrees of the pattern axis of the light as first emitted by the LED element.

It is a further object of the current invention to provide a LED lighting device having an interior or first reflecting optic that reflects the light emitted by a LED element to thereby bend that light to bring that light towards parallelism with a normal plane disposed perpendicular to the pattern axis of the light as first emitted by the LED element. Further the interior optic at least partially establishes the contour of a hollow opening in the body of the lighting device thereby increasing the surface area of the body, increasing the conduction of heat away from the LED element and thus improving the survivability of the lighting device under excessive current or best conditions. The lighting device additionally comprises an exterior reflecting optic to—after the emitted lights reflection at the interior reflecting optic—intersect and reflect the light to bend the light towards the pattern axis.

It is a further object of this invention to provide a LED lighting device which is compact such that a group of the lighting devices can be arranged with each emitting light and with the light emitted by each experiencing minimal obstruction by other lighting devices in the group. Additionally, each of the lighting devices includes an interior reflector to direct its emitted light to bring that light towards parallelism with a common plane. An exterior reflector is also provided to at least partially surround or encircle the group such that common portions of the exterior reflector reflect the light from the group of lighting devices to effect a large lighted surface.

It is a further object of this invention to provide a LED lighting device having a large lighted surface. The lighting device is configured to additionally minimize its thickness normal to the lighted surface such that the lighting device can be employed within diminutive spaces.

It is a further object of this invention to provide a lighting device having a cup reflector to reflect the light emitted by a LED element into an interior reflector which subsequently reflects and directs the light into an exterior reflector which then reflects and directs the light to emerge from a large lighted surface—the exterior reflector—of the lighting device.

BRIEF DESCRIPTION OF THE DRAWINGS

FIG. 1 is a front view of lighting device 100 representing an embodiment of the current invention.

FIG. 2 is a side view of interior lighting device 10 a component of FIG. 1.

FIG. 3 is a partial cross-sectional view of lighting device 100 across line 3–3' of FIG. 1 with exterior reflector ER1 removed.

FIG. 4 is an enlarged partial diagrammatic view of the portion of interior lighting device 10 within the dotted box DB shown in FIG. 3.

FIG. 6 represents an additional embodiment—interior lighting device 10A—of interior lighting device 10 a component of the current invention.

FIG. 7 represents an additional embodiment—interior lighting device 10B—of interior lighting device 10 a component of the current invention.

FIG. 9 represents an additional embodiment—interior lighting device 10D—of interior lighting device 10 a component of the current invention.

DETAILED DESCRIPTION OF THE DRAWING

Figure 21:
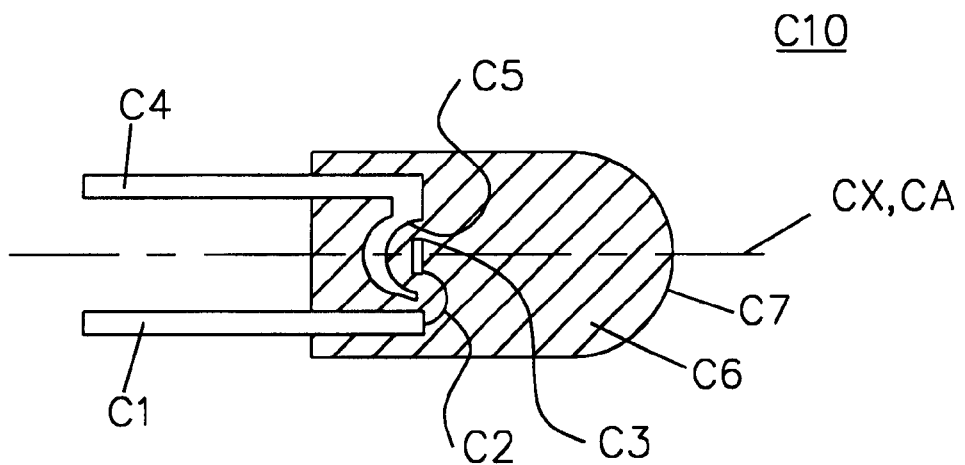
FIG. 21 is a diagrammatic partial cross-sectional view of a prior art LED lamp C10.
Figure 22:
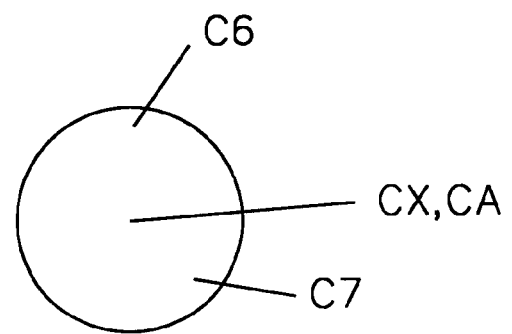
FIG. 22 is an end view of prior art LED lamp C10 of FIG. 21.

FIG. 1 is a front view of lighting device 100 comprising exterior reflector ER1 and interior lighting device 10 representing a first embodiment of the current invention. FIG. 2 is a side view of interior lighting device 10. FIG. 3 is a diagrammatic partial cross-sectional view taken across line 3–3' of FIG. 1 with exterior reflector ER1 removed. FIG. 3 represents interior lighting device 10 a component of the current invention and includes positive lead 1, contact wire 2, LED element 3, negative lead 4 and reflective cup 5 all of which function identically to the similar components previously described in the prior art device of FIG. 21. Interior lighting device 10 also includes resin body 6 constructed of a transparent material with an index of refraction exceeding 1.1. Resins such as acrylic, polycarbonate and epoxy are commonly used. For the FIG. 3 embodiment a resin with an index of refraction between 1.47–1.49 is used. Resin body 6 is a solid of revolution about lamp body axis X. Resin body 6 is contoured to form a hollow opening 8 with a contour at least partly defined or established by conical reflective surface 9. Conical reflective surface 9 is formed by rotating line 7 about body axis X and is a depressed surface in resin body 6. Conical reflective surface 9 forms a depression in resin body 6. Resin body 6 additionally comprises side wall 11.

FIG. 4 is an enlarged diagrammatic view of the portion of interior lighting device 10 within dotted box DB of FIG. 3. FIG. 4 includes a portion of conical reflective surface 9. LED element 3 is shown as a point source in place of its actual shape to facilitate a description of the optics. This does not alter the description of the concepts employed in the current invention as the current invention will function with many LED element contours and sizes.

In FIG. 4 LED element 3 like prior art emits light energy forming a spatial radiation pattern having a pattern axis A. The exact shape of this pattern varies depending upon the exact construction of LED element 3. Also the spatial radiation pattern is usually not perfectly symmetrical about pattern axis A. Nevertheless for the current discussion we can assume that LED element 3 emits light which is symmetrical about pattern axis A and which is most intense along the direction of pattern axis A. The intensity can be assumed to decrease in relation to the cosine of the angle between a specific direction and pattern axis A. Thus the light is most intense along pattern axis A and its intensity gradually decreases until it is extremely low at angles of divergence of approximately 75 degrees from pattern axis A. The current invention is employed to effect an enlarged lighted area lighting device. Usually the current invention increases the divergence of the light about pattern axis A. However, there are some embodiments wherein the divergence of the light is decreased. Also the spatial radiation pattern will be changed by the addition of reflector cup 5 behind LED element 3. The current invention can be successfully employed for almost all LED elements with or without reflective cups and regardless of the spatial radiation patterns of the emitted light.

Looking at FIGS. 1–4 but primarily at FIG. 4 conical reflective surface 9 intersects pattern axis A at point PO forming intersection angle A1. Intersection angle A1 is for this embodiment about 52 degrees. However, for other embodiments the magnitude of angle A1 may have values between 5 and 88 degrees.

Referring to FIG. 4, typical light ray R1 is emitted from LED element 3 at angle A2 about pattern axis A. Angle A2 for the current embodiment is about 25 degrees. However other light emitted from LED element 3 will be emitted at other angles within a range of from 0 to approximately 75 degrees about pattern axis A. Reflective surface 9 is normally designed to intersect most of the light emitted within the range between 4 and 45 degrees of pattern axis A and thereby reflect a large percentage of the emitted light energy. The desired pattern of light energy emerging from interior lighting device 10 and the design limitations placed upon interior lighting device 10 are factors which help establish the actual percentage of light intersected and reflected by reflective surface 9. Reflective surface 9 can also be considered the interior reflector.

Referring back to light ray R1 and employing classical optics light ray R1 intersects reflective surface 9 at point P1 forming angle A3. It also forms angle A4 with normal N1 to reflective surface 9 at point P1. Angle A4 exceeds the critical angle—approximately 43 degrees for the current embodiment—and therefore all of the light energy represented by light ray R1 is reflected at angle A5 relative to reflective surface 9. Angle A5 from classical optics is equal in magnitude to angle A3. Light ray R1 is typical of the light emitted from LED element 3 which is reflected by conical reflective surface 9. There are many other light rays emitted from LED element 3 at different angles which will be similarly reflected by reflective surface 9.

It is classical optics to realize that the light rays—after reflection—will all appear to come from a virtual point shown as 3R on FIG. 4. The reflected light rays will proceed to intersect side wall 11 and be refracted. The pattern of light impinging upon side wall 11 typified by light ray R1 will be substantially equal to the pattern that would be realized if LED element 3 were rotated twice angle A3 clockwise about point P1 into point 3R and the light permitted to proceed directly to side wall 11 without reflection. The pattern of light energy impinging on side wall 11 will be important in determining the pattern of light energy emerging from interior lighting device 10 and the final pattern of light emerging from an embodiment of the current invention such as lighting device 100. In the FIG. 4 embodiment the pattern of light energy impinging upon side wall 11 is substantially equal to the pattern emitted from LED element 3. It—through reflection—appears to side wall 11 to have been emitted from virtual point 3R. It also appears to have been rotated.

Reflected light ray R1 has therefore been reflected and thereby redirected to increase its divergence about pattern axis A. It also has been reflected to bring it towards parallelism with normal plane NP perpendicular to pattern axis A and coincident with LED element 3. Light ray R1 after reflection proceeds to intersect side wall 11 at point P2 forming angle A6 with normal N2 to side wall 11. Light ray R1 is then refracted by side wall 11 to emerge from lighting device 10 forming angle A7 with normal N2 to side wall 11. The overall result is that emerging light ray R1 has been reflected by the interior reflector and then refracted at side wall 11 to emerge from interior lighting device 10 with increased divergence about pattern axis A and towards parallelism with normal plane NP.

Looking closely again at FIG. 4, typical light ray R1 emitted above pattern axis A is reflected away from pattern axis A thus rotating it counterclockwise. An alternate light ray R1A which emerges from LED element 3 below pattern axis A also at angle A2 would be rotated clockwise due to reflection. This is according to classical optics and therefore not shown. Thus the divergence of the emitted light itself would increase. The divergence between light rays R1 and R1A would increase due to reflection. The divergence between the emitted light and pattern axis A would also increase. Finally, the divergence between the emitted light and axial plane AP coincident with pattern axis A would also increase.

If light ray R1 were emitted from LED element 3 at a reduced emission angle having a magnitude less than the angle A2 shown then—using classical optics—it can be seen that angle A3 would correspondingly be increased and angle A4 correspondingly decreased. If emission angle A2 were further decreased such that angle A4 decreased below the critical angle of the design the energy represented by light ray R1 would no longer be totally reflected but only partially reflected. In this instance the light energy which was not reflected would pass through reflective surface 9 and experience refraction. It would—as a result of the refraction—be redirected away from pattern axis A. Thus both reflected and refracted portions of the light intersecting reflective surface 9 would be redirected to increase their divergence about pattern axis A. For interior lighting device 10 the critical angle for A4 is approximately 43 degrees and for that critical angle, angle A2 would be approximately 5 degrees.

Upon continued reduction in angle A2 and the corresponding continued reduction in angle A4 light ray R1 would incur no reflection. The energy represented by light ray R1 would substantially all pass through reflective surface 9 and—due to refraction at that surface—rotate counterclockwise and bend away from pattern axis A. The actual angles of emission of emitted light ray R1 at which the ray incurs total refraction, partial reflection and total reflection are easily established using classical optics and the design factors of the interior lighting device. Design factors include the body resin, the body configuration and the distance D1 between LED element 3 and reflective surface 9. The condition under which some of the light energy emitted from LED element 3 and intersecting reflective surface 9 passes through reflective surface 9 can be beneficial. Requirements for the lighting device which require a portion of the light energy to leave the device to illuminate directions represented by acute angles relative to pattern axis A within a hemisphere disposed with its center at LED element 3 and bounded by normal plane NP could be satisfied by permitting a portion of the light to pass through reflective surface 9.

If on the other hand it is desirable to maximize the light bent away from pattern axis A or to assure a dark zone within a required acute angle about pattern axis A then reflective surface 9 can be coated with a reflective coating 12. This coating will if adequately thick assure that all of the light—regardless of the magnitude of emission angle A2—intersecting reflective surface 9 is reflected and bent away from pattern axis A. For the FIG. 4 embodiment if reflective surface 9 were coated with a metallic coating 12 a conical dark zone comprising angles up to approximately 52 degrees about pattern axis A would exist.

If on the other hand emitted light ray R1 emerges from LED element 3 at an angle larger than the 25 degree angle A2 illustrated it will be totally reflected. If angle A2 is increased to the extent that it exceeds angle A1 than the emitted light will not intersect conical reflective surface 9 but will directly intersect side wall 11 to be refracted and bent towards pattern axis A. Since normally there are size limitations upon lighting device 100 side wall 11 of interior lighting device 10 will be at a finite distance from pattern axis A. Therefore emitted light ray R1 will intersect side wall 11 before angle A2 equals angle A1. This prevents reflective surface 9 from intersecting all of the light energy emitted within included angle A1 and reduces the efficiency of the lighting device. This problem is ameliorated by minimizing reflector spacing distance D1. For many commercial LED lamps the outside diameter of the side wall 11 is established at 3 or 5 millimeters. A distance D1 exceeding three millimeters would make the current invention unacceptable for some lighting devices. This is especially true for designs having the size limitations of the commercial T1 and T1 3/4 lamps.

Resin body 6 is contoured to form hollow opening 8 and conical reflective surface 9. It is noteworthy to realize that for many uses LED lighting devices must fit within a limited space. Typically, this space would be a cylindrical volume with a defined diameter and length. For these uses—due to hollow opening 8—interior lighting device 10 has more surface area per unit of available volume than prior art designs such as that shown in FIG. 21. This is an important improvement because LED lamps are seriously degraded when the current they consume creates excessive internal heat. The present design in increasing the surface area increases the dissipation of the heat generated by LED element 3 and therefore improves its reliability and performance. This advantage is further increased in the embodiments of the current invention shown in FIGS. 6 and 7 to be later described where the surface area of resin body 6 is increased beyond the conical reflector of FIG. 4 due to the convex curves formed in resin body 6.

Figure 5:
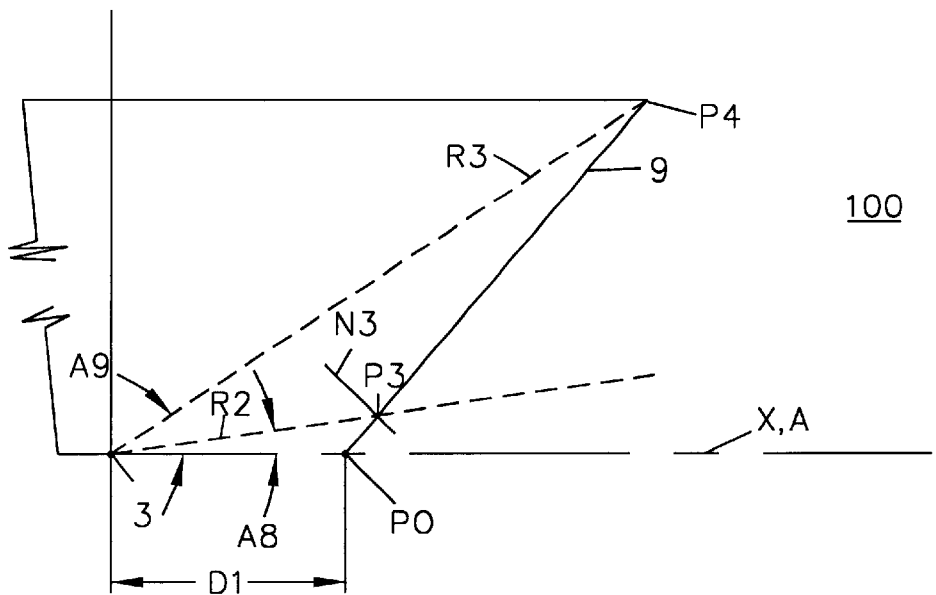
FIG. 5 is an enlarged partial diagrammatic view similar to FIG. 4 except FIG. 5 additionally shows the path of light rays R2 and R3.

FIG. 5 is an enlarged diagrammatic view similar to FIG. 4 except FIG. 5 shows light ray R2 emitted from LED element 3 at angle A8—approximately 4 degrees—which for interior lighting device 10 is less than the 5 degrees necessary to achieve total internal reflection at conical reflective surface 9. Light ray R2 Intersects conical reflective surface 9 at point P3 at normal N3 to conical reflective surface 9 where it is refracted and directed away from pattern axis A. FIG. 5 also shows light ray R3 emitted from LED element 3 at angle A9 relative to pattern axis A which intersects reflective surface 9 at its end point P4 and represents the angular limit of emitted rays which are intersected by conical reflective surface 9. For this situation conical reflective surface 9 will intersect all of the light energy emitted into the cone developed by rotating the line of light ray R3 about pattern axis A. Of this light energy most of the light emitted into the cone developed by rotating the line of light ray R2 about pattern axis A will pass through conical reflective surface 9 and be refracted. The difference between the light energy intersected and the light energy refracted is the light reflected by conical reflective surface 9. If reflector spacing distance D1 is made small enough angle A9 will be slightly less than the 52 degree magnitude of angle A1. Thus in the FIG. 4 embodiment where spacing distance D1 is established at under one millimeter conical reflective surface 9 reflects most of the light emitted by LED element 3 approximately between 4 degrees and 52 degrees of pattern axis A. This is desirable for many uses as a large percentage of the emitted light—especially for LED elements with reflective cups—is found in the angular range from 4 through 44 degrees of the pattern axis.

Figure 6:
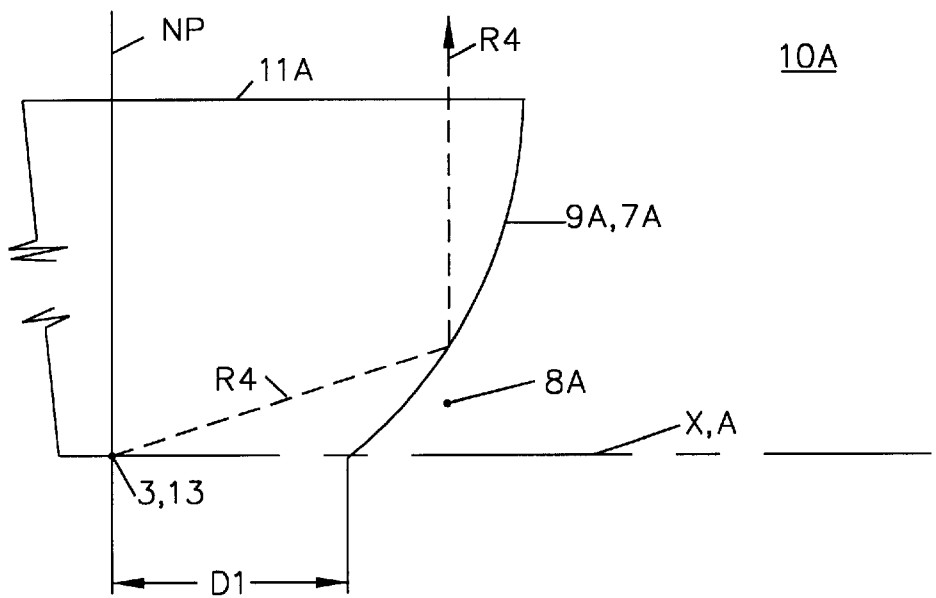
FIG. 6 is an enlarged partial diagrammatic view similar to FIG. 4 except in FIG. 6 an alternate curved reflective surface 9A is substituted for reflective surface 9.

FIG. 6 is a diagrammatic view similar to FIG. 4 illustrating an additional embodiment of the interior lighting device component of the current invention in which conical reflective surface 9 of FIG. 4 has been replaced by curved reflective surface 9A. This embodiment—identified as interior lighting device 10A—has hollow opening 8A with its contour at least partially defined or established by convex curved reflective surface 9A of resin body 6A. For this embodiment curved reflective surface 9A is parabolic however if a different pattern of reflected light is desired an elliptical, hyperbolic or other curve could be substituted for the parabolic curve. The selection of an alternate curve to achieve a specific light pattern emerging from the interior lighting device can be made using classical optics. Curved parabolic reflective surface 9A is a surface of revolution formed of resin body 6A by rotating parabolic line 7A about pattern axis A. Parabolic line 7A has its focal point 13 at LED element 3. Typical emitted light ray R4 intersects parabolic curved reflective surface 9A to be reflected parallel to normal plane NP and perpendicular to side wall 11A. Light ray R4 will therefore pass through side wall 11A unrefracted. The emerging light will be parallel to normal plane NP. If interior lighting device 10A is positioned so that normal plane NP is coincident with a horizontal plane the emerging light will be visible from all azimuthal directions achieving a very desirable characteristic for many lighting devices. This design is especially useful because the emitted light is substantially totally internally reflected at curved reflective surface 9A minimizing the loss of light at curved reflective surface 9A. Also the emitted light reaches curved reflective surface 9A without having to pass through a single surface or optical interface thereby avoiding the loss of light related to light passing through a first surface prior to reflection. After reflection at curved reflective surface 9A the reflected light is perpendicular to side wall 11A and therefore passes through side wall 11A without refraction thereby minimizing refractive losses at side wall 11A. Curved reflective surface 9A does not incur the problem previously described relating to conical reflective surface 9 in FIG. 4 of light emitted at small angles relative to pattern axis A passing through conical reflective surface 9. This results from the parabolic curvature of curved reflective surface 9A which assures that substantially all light emitted by LED element 3 which intersects reflective surface 9A will intersect with an angle exceeding the critical angle and therefore be totally internally reflected. Also after reflection the light is parallel. Therefore, the light impinging on side wall 11A has a virtual source point at an infinite distance. The spatial radiation pattern of light energy has thus been changed as it is now a light beam parallel to normal plane NP as a result of reflection.

Figure 7:
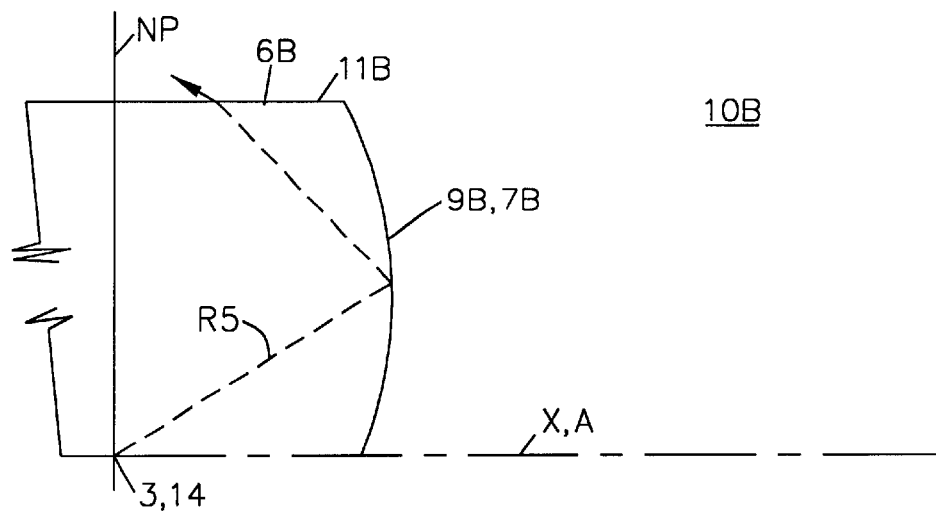
FIG. 7 is an enlarged partial diagrammatic view similar to FIG. 4 except in FIG. 7 an alternate elliptical reflective surface 9B is substituted for reflective surface 9.

FIG. 7 shows an additional embodiment of the interior lighting device component of the current invention similar to FIG. 4 except conical reflective surface 9 has been replaced with elliptical reflective surface 9B formed by a rotation about body axis X or of pattern axis A of elliptical line 7B having a focal point 14 at LED element 3. This embodiment is interior lighting device 10B. Typical light ray R5 emitted from LED element 3 intersects elliptical reflective surface 9B whereat it is reflected to converge towards normal plane NP. Reflected light ray R5 then intersects side wall 11B of resin body 6B and is refracted to further increase its convergence towards normal plane NP and increasing its divergence about pattern axis A. If elliptical line 7B 9B were rotated about LED element 3 or its focal point 14 positioned at a different location reflected light ray would have its reflected direction changed thereby changing its emerging direction from side wall 11B. This could be beneficial to achieve a specific user desired emerging light pattern.

Thus a refraction at side wall 11B can bend the light away from pattern axis A as shown in FIG. 7. It can also be made to bend the light towards pattern axis A as shown in FIG. 4 or to not bend the light as shown in FIG. 6. The effect on the bending of the light by side wall 11B can therefore be controlled by a proper selection of the curve and disposition of reflective surface 9B to achieve a specific emerging beam pattern.

Figure 8:
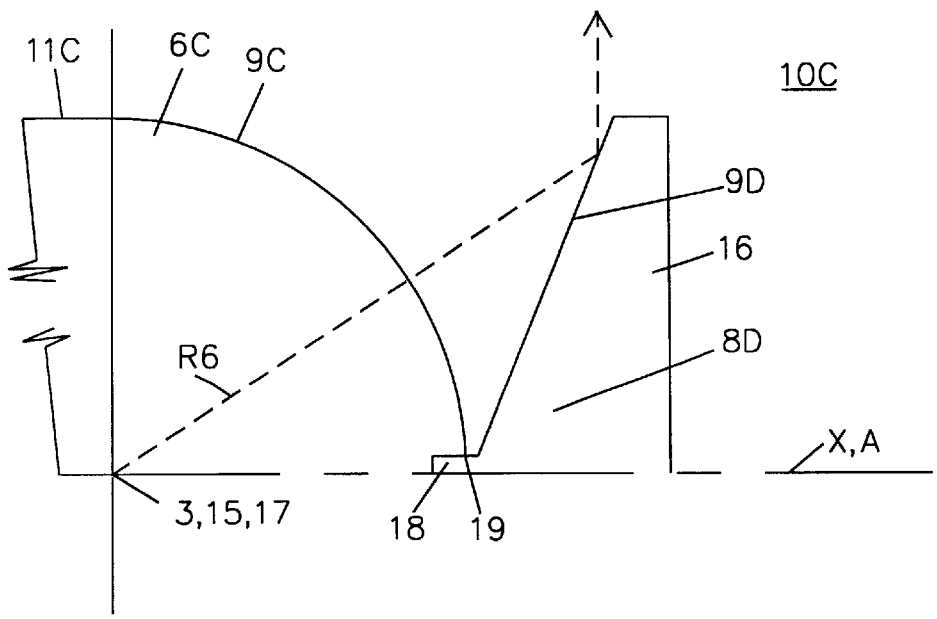
FIG. 8 is an enlarged partial diagrammatic view similar to FIG. 4 except in FIG. 8 an alternate discrete parabolic reflective surface 9D is substituted for reflective surface 9. This represents an additional embodiment—interior lighting device 10C—of interior lighting device 10 a component of the current invention.

FIG. 8 shows an additional embodiment of the interior lighting device component of the current invention similar to FIG. 4. FIG. 8 is reduced in size and represents interior lighting device 10C an alternate embodiment of the interior lighting device. Also in FIG. 8 the conical reflective surface 9 of FIG. 4 has been replaced with spherical surface 9C—connected to side wall 11C of resin body 6C. Spherical surface 9C has its center 15 at LED element 3. Also discrete parabolic reflector 16 optionally constructed of polished metal and having a parabolic reflective surface 9D with its focal point 17 at LED element 3 is attached to resin body 6C by means of an integral cylindrical dowel 18 pressed into a cylindrical hole 19 in resin body 6C. Typical light ray R6 emerging from LED element 3 passes through spherical surface 9C unrefracted and is reflected from parabolic reflective surface 9D to emerge substantially parallel to normal plane NP. Discrete parabolic reflector 16 does not have a hollow. However, if you look only at parabolic reflective surface 9D it could be viewed as having like other previously described reflectors a hollow 8D on a side of that surface opposite LED element 3.

Figure 9:
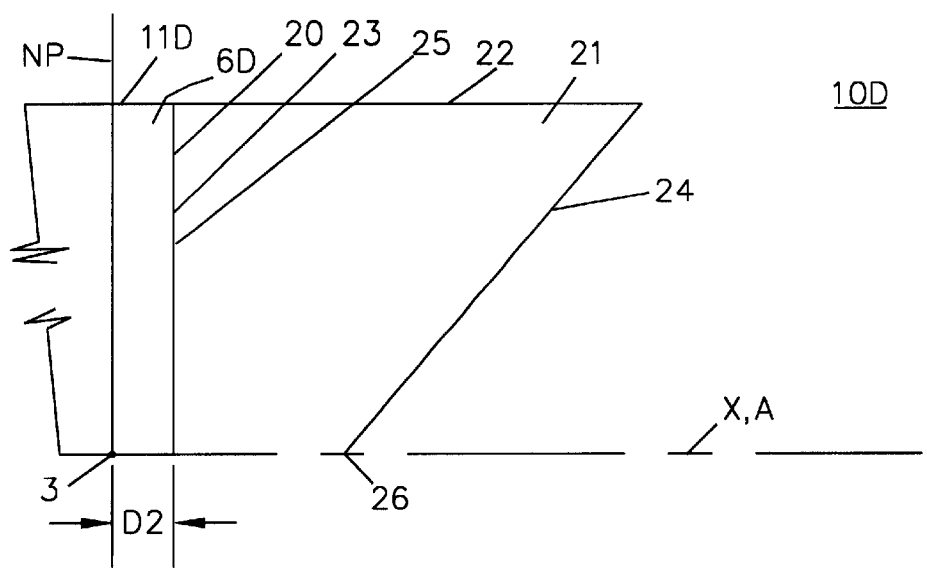
FIG. 9 is an enlarged partial diagrammatic view similar to FIG. 4 except in FIG. 9 a discrete optical lens comprising a conical reflective surface 24 is substituted for reflective surface 9.
Figure 10:
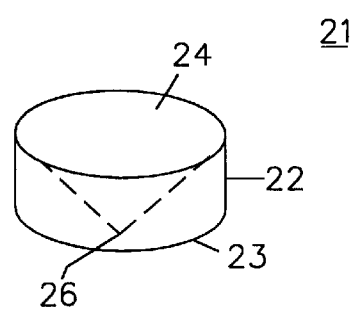
FIG. 10 is a perspective view of optical lens 21 which is employed in FIG. 9.

FIGS. 9 and 10 show an additional embodiment of the interior lighting device component of the current invention similar to that shown in FIG. 4 except that in FIG. 9 interior lighting device 10D is fabricated from two transparent components in place of the single component resin body 6 shown in FIG. 4. In FIG. 9 resin body 6D has flat surface 20 perpendicular to side wall 11D at a distance D2 from LED element 3. Distance D2 is less than distance D1 of FIG. 4. Optical lens 21 is a component of interior lighting device 10D. Optical lens 21 is shown in FIG. 10 reduced in size from the FIG. 9 drawing is formed of a transparent resin. It has a cylindrical wall 22, flat base 23 and conical reflective surface 24 including vertex 26. Optical lens 21 is placed on resin body 6D with flat surface 20 of resin body 6D mating with flat base 23 of optical lens 21 and glued in place with transparent glue 25. This embodiment functions optically similarly to the embodiment as described in FIG. 4. It is noteworthy to realize that gluing optical lens 21 onto resin body 6D does not always create a perfect optical path for the light which must pass through this interface. This can be a problem for some embodiments of the current invention. However, for other embodiments this imperfect interface can be beneficial in mixing or diffusing the light before reflection to abet the lighting device in complying with a requirement of a more uniform projected light beam.

Figure 11:
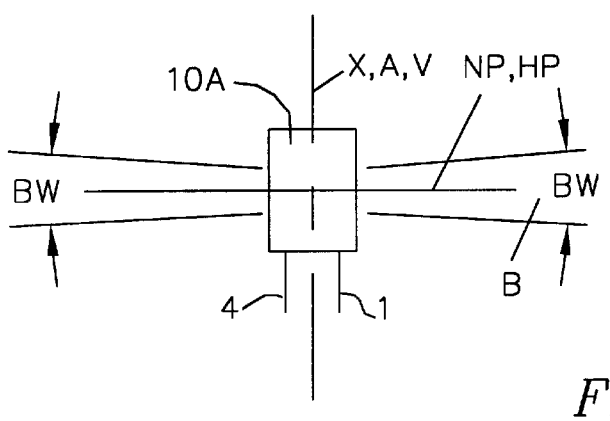
FIG. 11 is a side view of interior lighting device 10A of FIG. 6 disposed with its body axis and pattern axes vertical.

FIG. 11 is a side view of interior lighting device 10A of FIG. 6 disposed with pattern axis A along the vertical V. Since the embodiment comprising the parabolic reflector of FIG. 6 has been employed the emerging light forms light beam B emerging from interior lighting device 10A substantially centered about horizontal plane HP. Light beam B will usually have an angular beamwidth BW as a result of a number of factors including size of LED element 3 and imperfections in resin body 6A. For this vertical orientation of lighting device 10A normal plane NP is coincident with horizontal plane HP. In this disposition interior lighting device 10A is visible from all azimuthal directions making it desirable for many uses.

Figure 12:
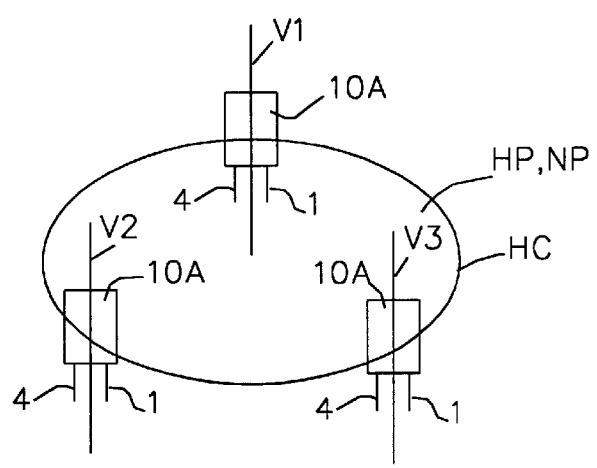
FIG. 12 is a diagrammatic perspective view of three interior lighting devices 10A according to FIG. 6 each disposed with its body axis along a vertical and positioned on a horizontal circle.

FIG. 12 is a perspective view of three interior lighting devices 10A according to FIG. 11 each disposed with its pattern axis along a vertical V1, V2 and V3 respectively and each equally spaced on a horizontal plane HP on horizontal circle HC. As shown in FIG. 11 each of the interior lighting devices emits a substantially horizontal circular beam B. The compact size of each of the interior lighting devices in combination with embodiments such as FIG. 11 which project light centered about the horizontal permit a group of the interior lighting devices to be positioned as shown on a circle of limited size without the bodies of adjacent interior lighting devices of the group from intercepting and obstructing a large portion of the emitted light. The emitted light beams therefore add to form a composite high intensity light beam. A single exterior reflector to be later described can efficiently be employed to reflect the light from a plurality of interior light sources.

The three interior lighting devices need not be on a circle but can be located forming a variety of relationships. Also they need not all be located on a single horizontal plane. The concept could also function if the interior lighting devices were on several planes or at various heights. Also FIG. 12 shows three interior lighting devices, however, larger quantities could be employed. Finally, other embodiments of the interior lighting device of the current invention can also be employed in groups such as shown in FIG. 12. For example, if a group of interior lighting devices 10 as detailed in FIG. 4 were employed, the emerging light would not be parallel to the normal plane but would form a composite light beam with a radiation pattern of the type formed by a conical reflector. Thus the high intensity and specific beam pattern required for many uses can now be achieved by a composite beam formed of a plurality of individual interior lighting devices selected according to their individual patterns each emitting a portion of the composite beam. An exterior reflector would be employed to reflect the light and effect a large lighted area lighting device in accordance with the current invention.

Figure 13:
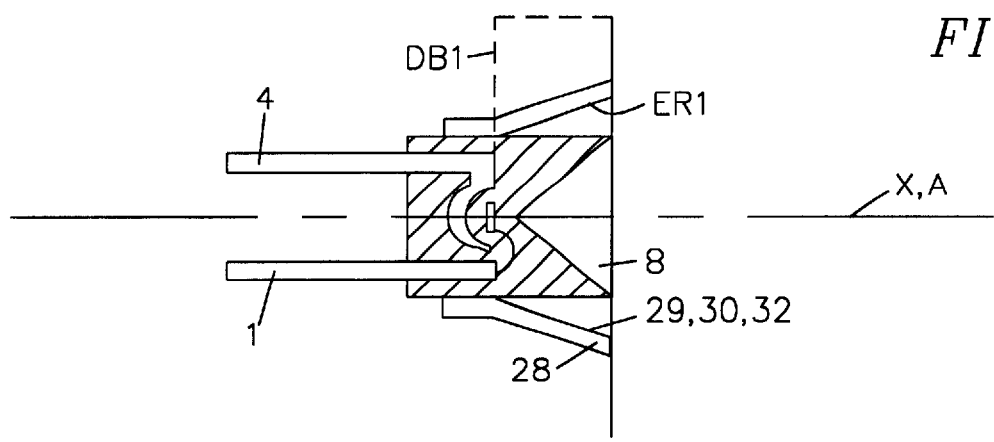
FIG. 13 is a partial cross-sectional view of lighting device 100 an embodiment of the current invention across line 13–13' of FIG. 1 with exterior reflector ER1 shown.
Figure 14:
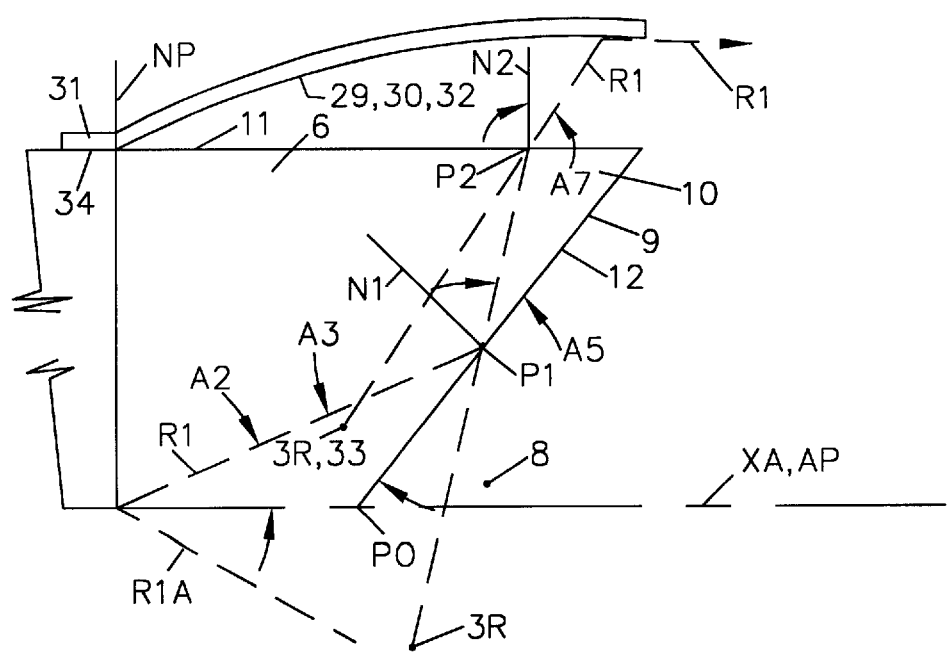
FIG. 14 is an enlarged partial diagrammatic view of the portion of lighting device 10 within the dotted box DB1 of FIG. 13.

FIG. 13 is a partial cross-sectional view of lighting device 100 across line 13–13' of FIG. 1. This view is similar to FIG. 3 except FIG. 13 additionally includes exterior reflector ER1 and represents a complete embodiment of the current invention. Therefore, the prior discussion of the optics of FIG. 3 applies equally to FIG. 13. FIG. 14 is an enlarged diagrammatic view of the portion of FIG. 13 within the dotted box DB1. This view is similar to FIG. 4 and therefore the optics described for the interior lighting device of FIG. 4 apply equally to FIG. 14. In FIG. 13 exterior reflector ER1 is optionally formed of a resin 28 and comprises parabolic surface 29, metallic coating 30 and sleeve 31. Exterior reflector ER1 presses onto body 6 with sleeve hole 34 in contact with side wall 11. Exterior reflector ER1 is larger than conical reflective surface 9 and at least partially surrounds or encircles conical reflective surface 9. It is disposed exterior to conical reflective surface 9. Parabolic reflective surface 29 is formed by rotating parabolic line 32 about pattern axis A. Parabolic Line 32 has its focal point 33 at the virtual point of emission 3V of refracted light ray R1 leaving side wall 11. Other light rays similar to light ray R1 refracted at side wall 11 from classical optics will have the common virtual point of emission 3V. Therefore, parabolic external reflector ER1 will reflect light rays refracted at side wall 11 to form a substantially parallel beam of light.

Looking at FIGS. 3, 13, 4 and 14 light ray R1 as previously described emerges from side wall 11 to intersect exterior reflector ER1 whereat it is reflected to bring it towards parallelism with pattern axis A. Other light rays will be reflected and redirected in a similar fashion because they will have the common virtual point of emission 3V. As a result of exterior reflector ER1 light emerging from lighting device 100 when viewed as shown in FIG. 1 will emerge from the large lighted area of exterior reflector ER1. Also due to the high efficiency of the reflective process, the emerging light will be efficiently redirected whereby a large percentage of the light first emitted by LED element 3 is reflected from exterior reflector ER1. Exterior reflector ER1 is for the present embodiment parabolic to effect a substantially parallel light beam. However, exterior reflector ER1 can have other shapes to effect other projected beam patterns and still incorporate the concepts of the current invention. Parabolic surface 29 can be conical or curved. It can be concave as shown or convex. It can be a surface of revolution about pattern axis A as shown or it can be asymmetrical such that it reflects the light to form an asymmetrical light beam about pattern axis A. Each shape will effect a different projected beam pattern.

Figure 15:
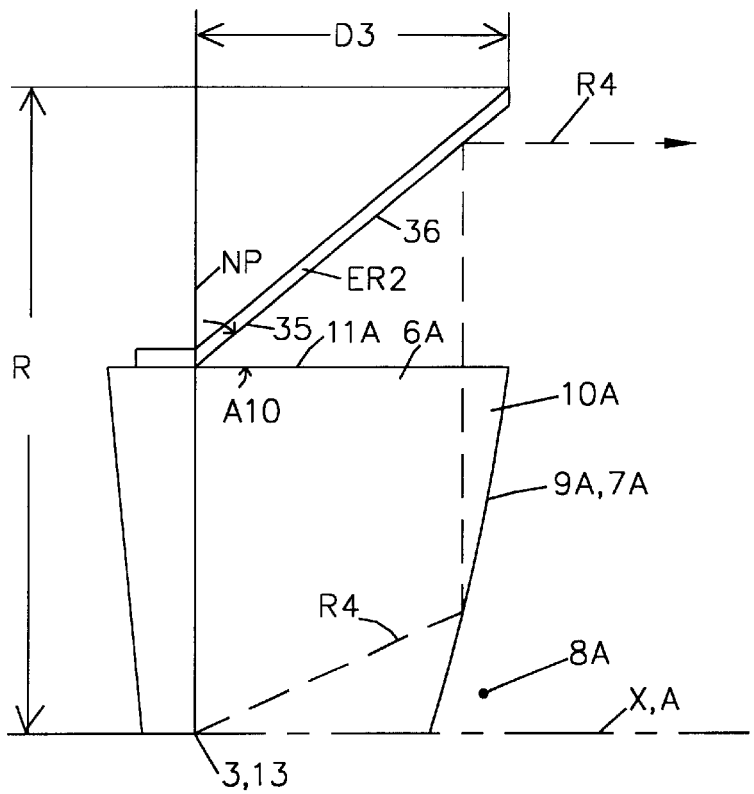
FIG. 15 is an enlarged partial diagrammatic view of interior lighting device 10A as shown in FIG. 6 except exterior reflector ER2 has been added making it an additional embodiment of the current invention.

FIG. 15 is a diagrammatic view of interior lighting device 10A described in FIG. 6 except exterior reflector ER2 has been added. Exterior reflector ER2 is of similar construction to exterior reflector ER1 described in FIG. 14 except exterior reflector ER2 has a conical reflective surface 35 developed from a rotation of line 36 which forms angle A10 with side wall 11A. For the FIG. 15 embodiment angle A10 is at 45 degrees. Light ray R4 as previously described emerging from interior lighting device 10A will intersect conical reflective surface 35 and according to classical optics be reflected to emerge parallel to pattern axis A. For similar reasons other light rays passing through side wall 11A will emerge parallel to pattern axis A to combine to form an intense parallel beam of light. If in place of a parallel beam of light a diverging beam of light is desired this can be easily achieved by changing angle A10. In either case the light will emerge from the large lighted area of conical reflective surface 35. Conical reflective surface 35 of exterior reflector ER2 has an outside radius R which is larger than its thickness D3. Thus the FIG. 15 lighting device provides the large lighted area of reflector ER2 with a small thickness D3. This is beneficial for many uses which require a lighting device having a large evenly lighted surface and a minimal thickness.

Figure 16:
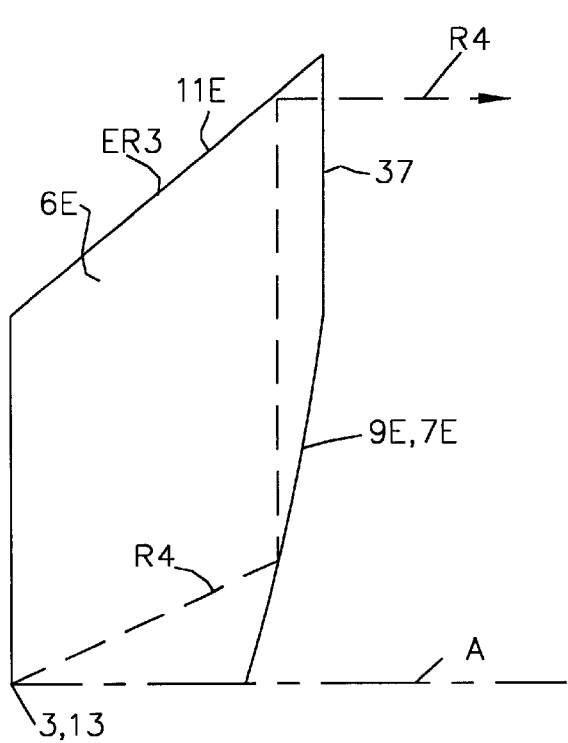
FIG. 16 is an enlarged partial diagrammatic view of an embodiment of the current invention similar to FIG. 15 except in FIG. 16 exterior reflector ER2 is replaced by exterior reflector ER3 formed of the body of the lighting device.

FIG. 16 is an embodiment of the current invention similar to FIG. 15 except resin body 6A is replaced with resin body 6E. Resin body 6E is contoured so that side wall 11E has a conical reflective surface 11E. For this configuration side wall 11E becomes the external reflector ER3. Resin body 6E also forms parabolic reflective surface 9E of a rotation of parabolic line 7E about pattern axis A—thus both the interior and exterior reflectors are formed of resin body 6E. This embodiment is less expensive to manufacture than FIG. 15. It functions optically equivalent to FIG. 15. In this embodiment light ray R4 remains in resin body 6E until it emerges by passing through exit surface 37.

Figure 17:
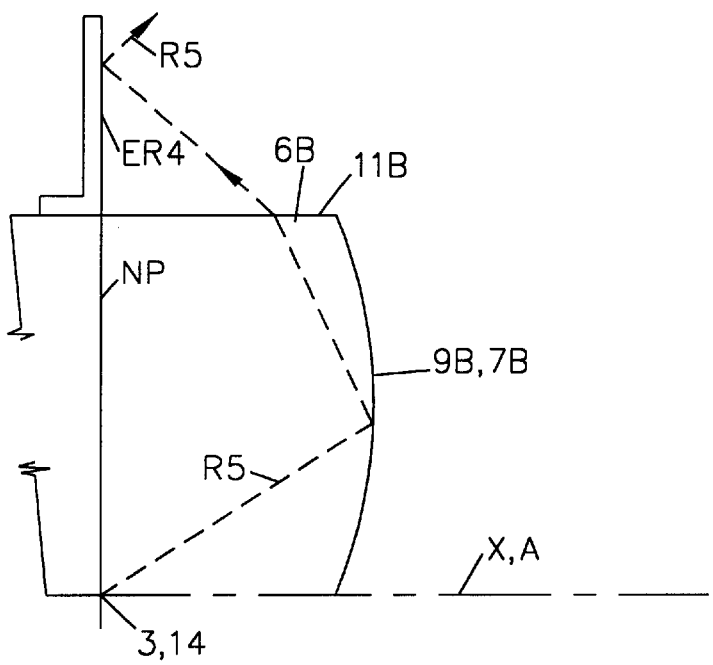
FIG. 17 is an enlarged partial diagrammatic view of interior lighting device 10B shown in FIG. 7 except in FIG. 17 exterior reflector ER4 has been added making it an additional embodiment of the current invention.

FIG. 17 is a diagrammatic view of interior lighting device 10B of FIG. 7 except exterior reflector ER4 perpendicular to pattern axis A has been added making it another embodiment of the current invention. Light ray R5 upon emerging from side wall 11B would be redirected by exterior reflector ER4 forming a large lighted surface.

Figure 18:
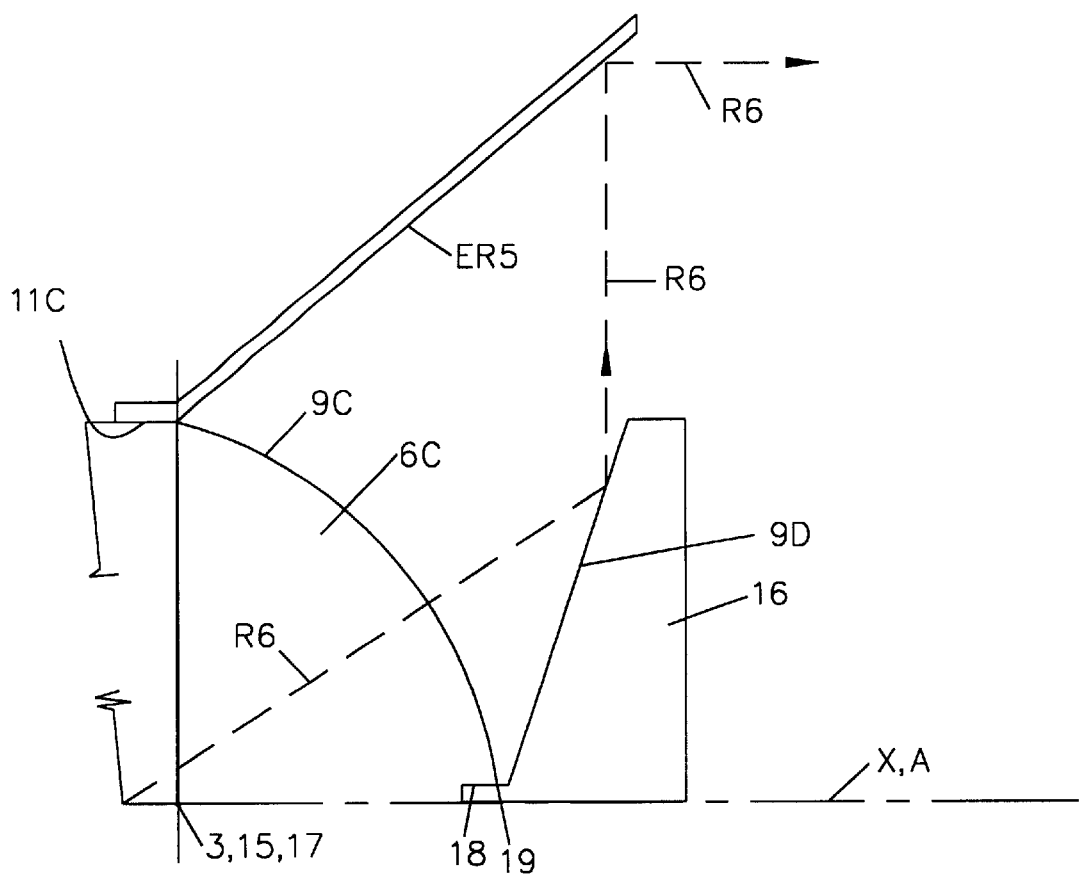
FIG. 18 is a diagrammatic view of interior lighting device 10C shown in FIG. 8 except in FIG. 18 exterior reflector ER5 has been added making it an additional embodiment of the current invention.

FIG. 18 is a diagrammatic view of interior lighting device 10C of FIG. 8 except conical exterior reflector ER5 has been added making it another embodiment of the current invention. This embodiment of the current invention functions optically similar to FIG. 15.

Figure 19:
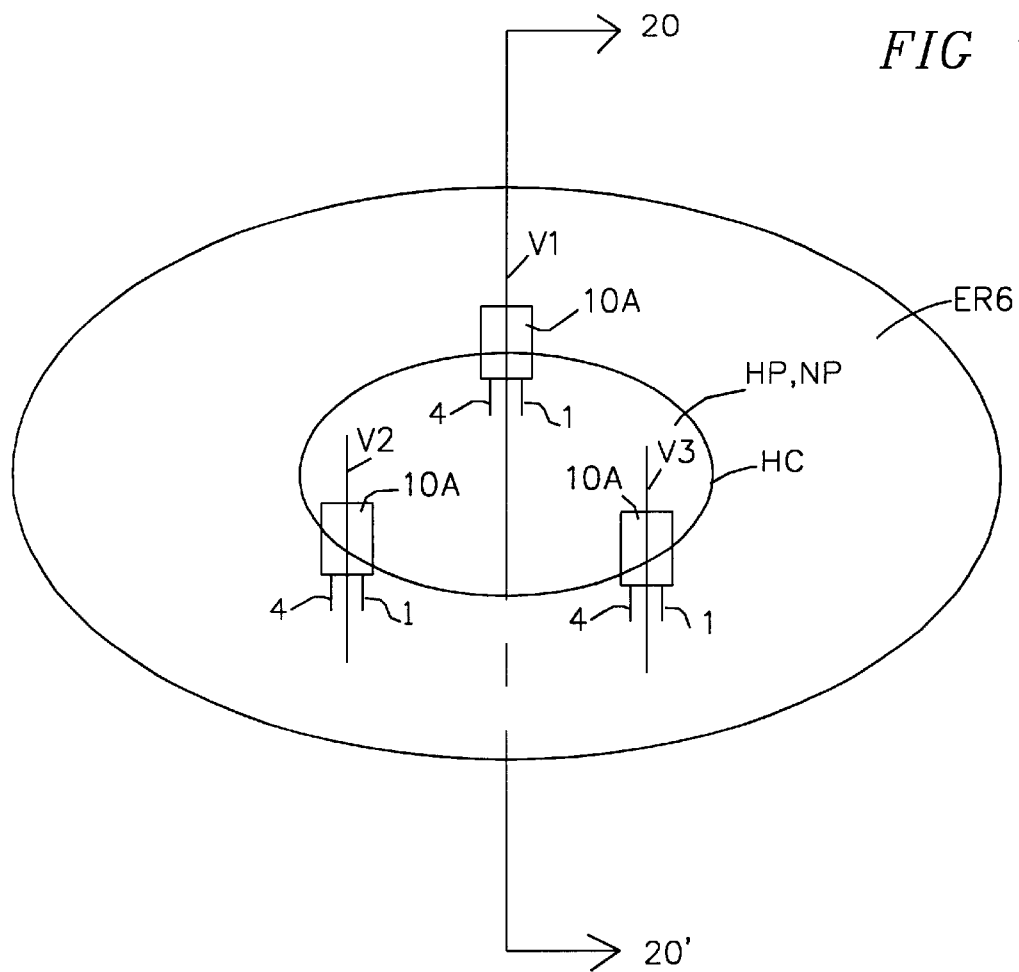
FIG. 19 is a perspective view of three lighting devices as shown in FIG. 12 except in FIG. 19 exterior reflector ER6 has been added making it an additional embodiment of the current invention.

FIG. 19 is a perspective view of the three interior lighting devices of FIG. 12 except a single conical exterior reflector ER6 has been added making it another embodiment of the current invention.

Figure 20:
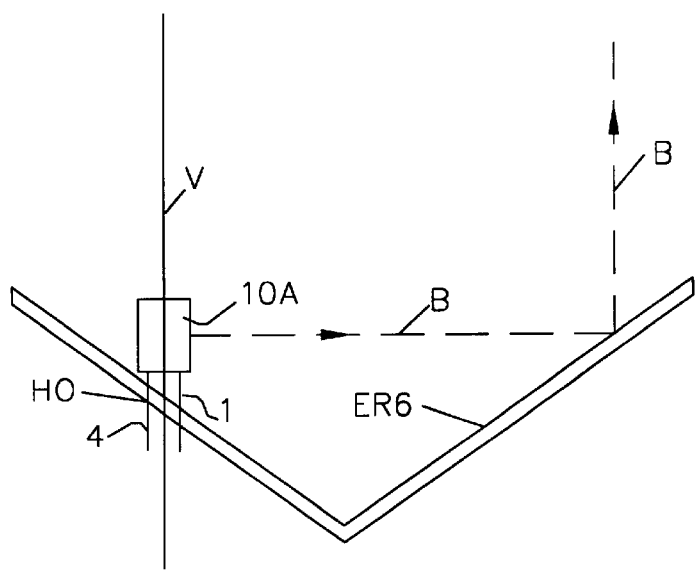
FIG. 20 is a diagrammatic partial cross-sectional view of the FIG. 19 embodiment of the current invention across line 20–20' of FIG. 19.

FIG. 20 is a diagrammatic partial cross-sectional view taken across line 20–20' of FIG. 19.

FIG. 20 shows only one of the interior lighting devices of FIG. 19 to simplify the illustration. In FIG. 20 light beam B intersects conical exterior reflector ER6 when it is reflected to bring it towards parallelism with vertical V. Light beams from the remaining interior lighting devices—not shown—would similarly be redirected by the common external reflector ER6. In construction the interior lighting devices could be pressed into holes HO in the exterior reflector or attached by other classical means to a common circuit board.

Although a common reflector ER6 is employed in FIG. 20 a an alternate embodiment could be achieved if each of the three individual or composite lighting devices had their own dedicated reflectors constructed as shown in FIG. 14. This would appear as shown in FIG. 12 except individual lighting devices according to FIG. 14 would replace the interior lighting device 10A shown. In this embodiment each of the FIG. 14 lighting devices would as previously described project their individual emitted light beams along the common vertical direction. These individual light beams would thus combine to form a high intensity composite light directed along the vertical direction.

Having now fully set forth the preferred embodiments and certain modifications of the concept underlying the present invention, various other embodiments as well as certain variations and modifications of the embodiment herein shown and described will obviously occur to those skilled in the art upon becoming familiar with said underlying concept. For instance, although this disclosure centered on visible light, the concepts described and the term light are meant to include all electromagnetic radiated energy including the infrared portion of the spectrum. Also reflective surfaces of contours different from those shown can be employed or combinations of those contours can be included in a single reflective surface. Additionally, the reflective contours shown can be rotated or translated to achieve specific emerging light patterns. Finally, the concepts disclosed in FIGS. 1–10 can be employed with any of the contours for exterior reflectors disclosed in FIGS. 13–19.

It is to be understood, therefore, that within the scope of the appended claims, the invention may be practiced otherwise then as specifically set forth herein.

What is claimed is:

1. A LED lighting device comprising:
   a LED element emitting a light;
   an interior reflector having a surface forming a hollow, said interior reflector attached to said LED element with said hollow on a side of said surface opposite said LED element, said interior reflector disposed intersecting said light and reflecting said light; and an exterior reflector attached to said interior reflector disposed intersecting and reflecting the light reflected by said interior reflector.

2. A LED lighting device comprising:

a LED element emitting a light;

a cup reflector attached to said LED element disposed intersecting said light and reflecting said light;

an interior reflector attached to said LED element with said LED element between said cup reflector and said interior reflector, said interior reflector disposed intersecting the light reflected by said cup reflector and reflecting the light; and an exterior reflector attached to said interior reflector disposed intersecting and reflecting the light reflected by said interior reflector.

3. A LED lighting device comprising:

a LED element emitting a light having a divergence;

an interior reflector attached to said LED element disposed intersecting said light, reflecting said light and increasing said divergence of said light;

an exterior reflector attached to said interior reflector disposed intersecting and reflecting the light reflected by said interior reflector; and said exterior reflector at least partially encircling said interior reflector and having a reflective area larger than a reflective area of said interior reflector.

4. A LED lighting device comprising:

a LED element emitting a light having a divergence;

an interior reflector attached to said LED element disposed intersecting said light, reflecting said light and increasing said divergence of said light; and an exterior reflector attached to said interior reflector disposed intersecting the light reflected by said interior reflector, reflecting the light and decreasing the divergence of the light.

5. A LED lighting device comprising:

a LED element emitting a light in a spatial radiation pattern having a divergence about a pattern axis;

an interior reflector attached to said LED element disposed intersecting said light, reflecting said light and increasing said divergence of said light about said pattern axis; and an exterior reflector at least partially encircling said interior reflector and attached to said interior reflector disposed intersecting and reflecting the light reflected by said interior reflector.

6. A LED lighting device comprising:

a LED element emitting a light in a spatial radiation pattern having a divergence about a pattern axis;

an interior reflector attached to said LED element disposed intersecting said light, reflecting said light and increasing said divergence of said light about said pattern axis; and an exterior reflector attached to said interior reflector; and disposed intersecting and reflecting the light reflected by said interior reflector.

7. A LED lighting device comprising:

a LED element emitting a light;

said LED element encapsulated in a light transmitting medium;

an interior reflector comprising a surface of said light transmitting medium disposed intersecting and reflecting said light, said surface comprising a hollow on a side of said surface opposite said LED element; and an exterior reflector attached to said interior reflector disposed intersecting and reflecting the light reflected by said interior reflector.

8. A LED lighting device comprising:

a LED element emitting a light;

said LED element encapsulated in a light transmitting medium;

an interior reflector comprising a surface of said light transmitting medium disposed intersecting and reflecting the light; and an exterior reflector comprising a surface of said light transmitting medium disposed intersecting and reflecting the light reflected by said interior reflector.

9. A LED lighting device comprising:

a LED element emitting a light in a spatial radiation pattern having a divergence about a pattern axis;

a light transmitting medium encapsulating said LED element, said light transmitting medium having a refracting surface and an interior reflector surface;

an interior reflector comprising said interior reflector surface disposed intersecting said light and reflecting said light;

an exterior reflector attached to said interior reflector;

said refracting surface disposed between said interior reflector and said exterior reflector intersecting and refracting the light reflected by said interior reflector; and said exterior reflector disposed intersecting and reflecting the light refracted by said refracting surface.

10. A lighting device according to any of claims 1 thru 9 wherein:

said interior reflector comprises a surface of revolution.

11. A lighting device according to any of claims 1 thru 9 wherein:

said exterior reflector comprises a surface of revolution.

12. A lighting device according to any of claims 1 thru 9 which further includes:

said interior reflector comprising a conical contour.

13. A lighting device according to any of claims 1 thru 9 which further includes:

said interior reflector comprising a curved contour.

14. A lighting device according to any of claims 1 thru 9 which further includes:

said interior reflector comprising a parabolic contour.

15. A lighting device according to any of claims 1 thru 9 which further includes:

said exterior reflector comprising a curved contour.

16. A lighting device according to any of claims 1 thru 9 which further includes:

said exterior reflector comprising a conical contour.

17. A lighting device according to any of claims 1 thru 9 which further includes:

said exterior reflector comprising a parabolic contour.

18. A lighting device according to any of claims 1 thru 9 which further includes:

said interior reflector is nonmetallic.

19. A lighting device according to any of claims 1 thru 9 which further includes:

said exterior reflector is nonmetallic.

20. A lighting device according to any of claims 1,2,4,5, 6,7,8, and 9 which further comprises:

said LED element emitting a second light;

a cup reflector attached to said LED element disposed with said LED element between said interior reflector and said cup reflector, said cup reflector intersecting said second light and reflecting said second light;

said interior reflector additionally intersecting and reflecting the second light reflected by said cup reflector; and said exterior reflector additionally intersecting and reflecting the second light reflected by said interior reflector.

21. A lighting device according to any of claims 1, 2, 3, 4, 7, 8 and 9 wherein:

said light comprises a spatial radiation pattern having a divergence about a pattern axis.

22. A lighting device according to any of claims 1,2,4,5, 6,7,8 and 9 wherein:

said exterior reflector comprises a reflective area larger than a reflective area of said interior reflector.

23. A lighting device according to any of claims 1 thru 6 which further includes:

a light transmitting medium encapsulating said LED element and having a light refracting surface disposed between said interior reflector and said exterior reflector.

24. A lighting device according to any of claims 1 thru 6 wherein:

said interior reflector is formed of a light transmitting medium; and said light transmitting medium encapsulates said LED element.

25. A lighting device according to any of claims 1 thru 6 wherein:

said interior reflector is formed of a light transmitting medium; and said exterior reflector is formed of said light transmitting medium.

26. A lighting device according to any of claims 1 thru 6 which further includes:

an optical surface between said LED element and said interior reflector.

27. A lighting device according to any of claims 1 thru 6 wherein:

said interior reflector is a component of an optical element glued to a transparent medium; and said transparent medium encapsulates said LED element.

28. A LED lighting device comprising:

a plurality of interior lighting devices each comprising a LED element emitting a light, an interior reflector having a surface forming a hollow, said interior reflector attached to said LED element with said hollow on a side of said surface opposite said LED element, said interior reflector disposed intersecting said light and reflecting said light; and an exterior reflector attached to said plurality of interior lighting devices disposed with a common portion of said exterior reflector intersecting and reflecting the light reflected by said interior reflector of each of said interior lighting devices.

29. A LED lighting device comprising:

a plurality of composite lighting devices each comprising a LED element emitting a light an interior reflector having a surface forming a hollow, said interior reflector attached to said LED element with said hollow on a side of said surface opposite said LED element, said interior reflector disposed intersecting said light and reflecting said light, an exterior reflector attached to said interior reflector disposed intersecting and reflecting the light reflected by said interior reflector forming an exterior reflected light; and each of said composite lighting device attached with said exterior reflected light directed into a composite light direction.

30. A LED lighting device comprising a LED element for emitting light along a pattern axis;

an interior reflector spaced forwardly of said LED element on said axis for bending light from said element away from said axis; and an exterior reflector spaced from and encircling said interior reflector to reflect light received from said interior reflector.

31. A LED lighting device as set forth in claim 30 wherein said exterior reflector has a surface for reflecting light received from said interior reflector towards parallelism with said pattern axis.

32. A LED lighting device as set forth in claim 30 wherein said exterior reflector has a surface for reflecting light received from said interior reflector away from parallelism with said pattern axis to increase the divergence of the light reflected therefrom.

33. A LED lighting device as set forth in claim 30 which further comprises a resin body enclosing said LED element and having a contoured surface thereof forming said interior reflector.

34. A LED lighting device as set forth in claim 33 wherein said contoured surface of said resin body is a parabolic contour.

35. A LED lighting device as set forth in claim 33 wherein said resin body has an index of refraction between 1.47 and 1.49.

36. A LED lighting device as set forth in claim 33 wherein said contoured surface is roughened.

37. A LED lighting device as set forth in claim 33 wherein said contoured surface has a portion thereof of a convex curved shape.

38. A LED lighting device as set forth in claim 33 wherein said contoured surface is at least partially parabolic and said resin body has a conical peripheral wall.

39. A LED lighting device as set forth in claim 33 which further comprises a reflective coating on at least some of said contoured surface for reflecting light from said LED element to a peripheral wall of said resin body.

40. A LED lighting device as set forth in claim 30 which further comprises a cup reflector spaced rearwardly of said LED on said pattern axis on a side opposite said interior reflector for receiving and reflecting light from said LED element towards said contoured surface.

41. A LED lighting device as set forth in claim 33 wherein said resin body has an outer peripheral surface defining said exterior reflector.

42. A LED lighting device as set forth in claim 30 wherein said exterior reflector has a parabolic surface for receiving and reflecting light from said interior reflector.

43. A LED lighting device as set forth in claim 42 wherein said exterior reflector is a resin body and said parabolic surface has a metallic coating thereon.

44. A LED lighting device as set forth in claim 42 wherein said exterior reflector has a conical reflective surface.

45. A LED lighting device as set forth in claim 42 wherein conical reflective surface of said exterior reflector has an outside radius greater than the thickness thereof to provide a large lighted area relative to said thickness.

46. A LED lighting device as set forth in claim 30 wherein said exterior reflector has a reflective surface disposed perpendicularly of said pattern axis.

47. A LED lighting device as set forth in claim 30 wherein said interior reflector has a parabolic reflective surface facing said LED element to reflect light outwardly from said pattern axis to said exterior reflector.

48. A LED lighting device as set forth in claim 47 further comprising a resin body enclosing said LED element and having a spherical surface facing said parabolic reflective surface of said interior reflector.

49. A lamp comprising a plurality of LED lighting devices, each said lighting device having a LED element for emitting light along a pattern axis and an interior reflector spaced forwardly of said LED element on said axis for bending light from said element away from said axis; and an exterior reflector spaced from and encircling said lighting devices to reflect light received from said interior reflector of each said lighting device.

50. A lamp as set forth in claim 49 wherein said exterior reflector has a surface for reflecting light received from said interior reflector towards parallelism with said pattern axis.

51. A lamp comprising a plurality of LED lighting devices disposed in a common direction to form a high intensity composite light directed in said common direction, each said lighting device having a LED element for emitting light about a pattern axis approximately parallel to said common direction, an interior reflector spaced forwardly of said LED element on said axis for bending light from said element away from said axis, and an exterior reflector spaced from and encircling said lighting devices to reflect light received from said interior reflector of each said lighting device.

52. A LED lighting device comprising a LED element disposed on an axis for emitting light therefrom;

a resin body enclosing said LED element and having an outer peripheral wall and a contoured surface at one end disposed coaxially of said axis, said body having an index of refraction and said surface being light reflective for reflecting light from said LED element off said contoured surface to and through said peripheral wall to create an enlarged lighted surface; and a cup reflector on said axis and within said body on a side opposite said contoured surface for receiving and reflecting light from said LED element towards said contoured surface.

53. A LED lighting device as set forth in claim 52 wherein said index of refraction is between 1.47 and 1.49.

54. A LED lighting device as set forth in claim 52 wherein said contoured surface is roughened.

55. A LED lighting device as set forth in claim 52 wherein said contoured surface has a parabolic contour.

56. A LED lighting device as set forth in claim 52 wherein said contoured surface has a portion thereof of a convex curved shape.

57. A LED lighting device as set forth in claim 52 wherein said contoured surface is at least partially parabolic and said peripheral wall is conical.

58. A LED lighting device as set forth in claim 52 which further comprises a reflective coating on at least some of said surface for reflecting light from said LED element to said peripheral.

59. A LED lighting device comprising a LED element disposed on an axis for emitting light therefrom; and a resin body enclosing said LED element and having an outer peripheral wall and a contoured surface at one end to encircle said axis, said body having an index of refraction exceeding 1.1 and said surface being light reflective for reflecting light from said LED element off said contoured surface in a diverging pattern from said axis to pass through said peripheral wall to create an enlarged lighted surface.

60. A LED lighting device comprising a LED element disposed on an axis for emitting light therefrom; and a resin body enclosing said LED element and having a contoured surface at one end to encircle said axis, said body having an index of refraction exceeding 1.1 and said surface being light reflective for reflecting light from said LED element off said contoured surface in a diverging pattern from said axis.

61. A LED lighting device comprising a LED element for emitting a light in a spatial radiation pattern about a pattern axis, said light having a divergence about said pattern axis; and a light transmitting medium encapsulating said LED element and having an exterior surface of conical contour within a hollow opening to form a reflector about said pattern axis for reflecting said light from said LED element with an increased divergence.

62. An LED element as set forth in claim 61 wherein said reflector is disposed to intersect said light from said LED to form an angle at least equal to a critical angle.

63. A LED lighting device comprising a LED element for emitting a light in a spatial radiation pattern about a pattern axis, said light having a divergence about said pattern axis; and a light transmitting medium encapsulating said LED element and having an exterior surface of convex contour within a hollow opening to form a reflector about said pattern axis for bending said light from said LED element away from said pattern axis.

64. An LED element as set forth in claim 63 wherein said reflector is disposed to intersect said light from said LED to form an angle at least equal to a critical angle.

65. A LED lighting device comprising a LED element for emitting a light in a spatial radiation pattern about a pattern axis, said light having a divergence about said pattern axis; and a light transmitting medium encapsulating said LED element and having an exterior surface within a hollow opening to form a reflector about said pattern axis for intersecting and reflecting said light from said LED element with an increased divergence.

66. An LED element as set forth in claim 65 wherein said reflector is disposed to intersect said light from said LED to form an angle at least equal to a critical angle.

* * * * *